(12) United States Patent
Rasson et al.

(10) Patent No.: US 11,346,667 B2
(45) Date of Patent: May 31, 2022

(54) SELF-CALIBRATING AND AUTONOMOUS MAGNETIC OBSERVATORY

(71) Applicant: INSTITUT ROYAL METEOROLOGIQUE DE BELGIQUE, Brussels (BE)

(72) Inventors: Jean Rasson, Viroinval (BE); Alexandre Gonsette, Labuissiere (BE); Francois Humbled, Gimnee (BE)

(73) Assignee: Institute Royal Meteorologique De Belgique, Brussels (BE)

( * ) Notice: Subject to any disclaimer, the term of this patent is extended or adjusted under 35 U.S.C. 154(b) by 850 days.

(21) Appl. No.: 16/098,229

(22) PCT Filed: Apr. 18, 2017

(86) PCT No.: PCT/EP2017/059196
§ 371 (c)(1),
(2) Date: Nov. 1, 2018

(87) PCT Pub. No.: WO2017/190951
PCT Pub. Date: Nov. 9, 2017

(65) Prior Publication Data
US 2019/0162537 A1    May 30, 2019

(30) Foreign Application Priority Data
May 4, 2016   (BE) .................... 2016/5322

(51) Int. Cl.
*G01C 17/02*    (2006.01)
*G01R 33/02*    (2006.01)
*G01V 3/08*    (2006.01)
(52) U.S. Cl.
CPC ............ *G01C 17/02* (2013.01); *G01R 33/02* (2013.01); *G01R 33/0206* (2013.01); *G01V 3/08* (2013.01)

(58) Field of Classification Search
None
See application file for complete search history.

(56) References Cited

U.S. PATENT DOCUMENTS

2019/0086480 A1\* 3/2019 Guo ................... G01R 33/0017

OTHER PUBLICATIONS

Gravrand, O. et al., "On the calibration of a vectorial 4He pumped magnetometer", Earth Planets Space, 2001, pp. 949-958, vol. 53, © 2001 The Society of Geomagnetism and Earth, Planetary and Space Sciences (SGEPSS); The Seismological Society of Japan; The Volcanological Society of Japan; The Geodetic Society of Japan; The Japanese Society for Planetary Sciences.

(Continued)

*Primary Examiner* — Matthew G Marini
(74) *Attorney, Agent, or Firm* — Blue Filament Law PLLC

(57) ABSTRACT

An autonomous magnetic observatory is provided that includes a scalar magnetometer for measuring the modulus of the local magnetic field vector F; an angular magnetometer for measuring the vertical direction, the direction of geographic North, and the direction of the local magnetic field vector F; a variometer for measuring three variations in the local magnetic field vector F; a clock; and a controller. In which observatory, the controller is configured to control and manage the orientation of sensors, to acquire the measurements of the variometer, of the scalar magnetometer, of the angular magnetometer and of the variometer, and to process the acquired measurements in order to obtain automatically, the local magnetic field vector F and the errors in the measurements associated with each instrument.

19 Claims, 7 Drawing Sheets

(56) References Cited

OTHER PUBLICATIONS

Auster, H.U. et al., "GAUSS: Geomagnetic Automated System", Publs. Inst. Geophys. Pol. Acad. SC., C-99 (398), 2007, 11 pages.

Auster, H.U. et al., "Automation of absolute measurement of the geomagnetic field", Earth Planets Space, Published Online: Sep. 28, 2007, pp. 1007-1014, vol. 59, © 2007 The Society of Geomagnetism and Earth, Planetary and Space Sciences (SGEPSS); The Seismological Society of Japan; The Volcanological Society of Japan; The Geodetic Society of Japan; The Japanese Society for Planetary Sciences; TERRAPUB.

Hrvoic, I. et al., "Instruments and Methodologies for Measurement of the Earth's Magnetic Field", In: "Geomagnetic Observations and Models, Chapter 4", Oct. 2013, 39 pages.

International Search Report dated Jul. 11, 2017 for International Application No. PCT/EP2017/059196 filed Apr. 18, 2017.

\* cited by examiner

SELF-CALIBRATING AND AUTONOMOUS MAGNETIC OBSERVATORY

TECHNICAL FIELD

According to a first aspect, the invention relates to magnetic observatories (of the local terrestrial magnetic field) and more particularly to autonomous magnetic observatories.

According to a second aspect, the invention relates to an automatic and self-calibrated method for obtaining the local (terrestrial) magnetic field vector.

PRIOR ART

A certain number of what are called autonomous magnetic observatories (of the local terrestrial magnetic field) already exist. In practice, these observatories are only partially autonomous. For example, the article "*On the calibration of a vectorial 4He pumped magnetometer*" by O. Gravrand, A. Khokhlov, J. L. Le Mouel, and J. M. Leger published in Earth Planets Space, 53, 949-958, 2001 discloses a vector magnetometer employing optically pumped helium vapor and a calibration method for this magnetometer. This magnetometer makes it possible to obtain an absolute measurement of the strength of the local magnetic field and the variations in three orthogonal components of the local magnetic field, which variations are measured simultaneously and at the same location. This observatory also provides a confirmation of vertical attitude. The method for processing the data of the magnetometer allows, from the three variations in the components and from the absolute value of the modulus of the local magnetic field vector, a calibration of scale factors to be obtained, allowing the variations in the three components of the local magnetic field vector in SI units to be obtained.

Nevertheless, this observatory does not provide an automatic measurement of the direction of the local magnetic field. It also does not deliver the vertical of the site, nor the direction of geographic north. Drifts due to temperature variations are not corrected. Lastly, the method does not allow orthogonality errors that appear over time to be corrected.

A second partially autonomous magnetic observatory is disclosed in "GAUSS: Geomagnetic Automated System" by H. U. AUSTER, M. MANDEA, A. HEMSHORN, M. KORTE and E. PULZ in PUBLS. INST. GEOPHYS. POL. ACAD. SC., C-99 (398), 2007. This publication discloses an apparatus for automatically measuring the orientation of the local magnetic field vector. This autonomous observatory also self-calibrates horizontal and vertical attitude by detecting the local vertical.

Nevertheless, this observatory does not automatically deliver the value of the modulus of the local magnetic field vector, nor the variations in the local magnetic field vector in three directions, nor the direction of geographic north. No self-calibration method for correcting temperature effects, for measuring the scale factor and for carrying out the orthogonal calibration is proposed.

In conclusion, although these magnetic observatories are often called autonomous observatories, they are in fact only partially autonomous and require an outside intervention to obtain the local magnetic field vector.

SUMMARY OF THE INVENTION

According to a first aspect, one of the aims of the present invention is to provide a device for obtaining an autonomous and self-calibrated measurement of the local magnetic field vector, the local magnetic field vector having to be understood in the sense local magnetic field of the Earth.

For this purpose, the magnetic observatory for measuring the local magnetic field vector comprises: a scalar magnetometer for obtaining the absolute measurement of the modulus of the local magnetic field vector, a magnetic variometer that records variations in three mathematically independent components of the local magnetic field vector, a clock, an angular magnetometer and a controller. The angular magnetometer comprises a first holder that is orientable about a first axis of rotation called the main axis of rotation allowing a horizontal orientation of the first orientable holder to be obtained, said first orientable holder comprising: a main motor for modifying the horizontal orientation of the first orientable holder about the main axis, an inclination sensor, a second holder that is orientable about a second axis of rotation called the secondary axis of rotation, orthogonal to the main axis, allowing a vertical orientation of the second orientable holder to be obtained, said second orientable holder comprising: a secondary motor for modifying the vertical orientation of the second orientable holder about the secondary axis, a magnetic sensor for measuring the direction of the local magnetic field vector, a north-seeking device. The angular magnetometer furthermore comprises a means for controlling the main and secondary motors and a device for angularly measuring and acquiring horizontal and vertical orientations of the first and second orientable holders.

The second orientable holder may comprise the inclination sensor. The inclination sensor may be mounted on the first orientable holder or on the second orientable holder.

The magnetic observatory is made autonomous and capable of self-calibrating the measurements of the local magnetic field by virtue of the controller, which is configured to automatically control the main motor and the secondary motor, to manage the orientation: of the inclination sensor for measuring the direction of the vertical, of the north-seeking device for measuring the direction of geographic north and of the magnetic sensor for measuring the direction of the local magnetic field vector. It is also configured to acquire: the angles of the direction of the local magnetic field vector with respect to geographic north and to the vertical depending on the horizontal and vertical orientations of the first and second orientable holders, which orientations are measured with the angularly measuring and acquiring device, the three variations in the local magnetic field vector, which variations are measured by the variometer, and the values of the modulus of the local magnetic field vector, which values are measured by the scalar magnetometer. Lastly, it is configured to process the data acquired beforehand in order to automatically obtain the local magnetic field vector and the errors in the measurements associated with each instrument.

Conventional magnetic observatories are often installed in buildings comprising rooms the temperature of which is controlled in order to avoid excessive instrumental deviation. In addition, certain measurements are carried out manually by a highly qualified operator. These observatories cannot therefore be installed anywhere. An autonomous observatory has the advantage of being able to be installed where desired and, above all, of not requiring the presence of a qualified operator. The cost of such an observatory is therefore clearly lower and may be used more easily. The measurements may also be carried out with a higher frequency and more reliably. With respect to the preceding "autonomous" observatories, the advantage resides in the presence of a set of instruments that, combined together, make it possible to obtain a self-calibration and therefore a clearly better precision than a simple juxtaposition thereof would allow.

Preferably, the first and second orientable holders, the main and secondary motors, the north-seeking device, the inclination sensor, the means for controlling the main and secondary motors and the angularly measuring and acquiring device are formed from non-magnetic components, defined such that the magnetic susceptibility of the materials is comprised between −1 and 1, preferably between $-10^{-1}$ and $10^{-1}$, and even more preferably between $-10^{-3}$ and $10^{-3}$.

For example, the non-magnetic components are materials chosen from: ceramic, aluminum, arcap, titanium, copper, ertalon, nylon, ertacetal, peek.

The choice of these materials is crucial to guarantee a good measurement of the local magnetic field, i.e. a measurement not perturbed by the instruments themselves.

Preferably, the scalar magnetometer is of one of the following types: proton magnetometer, Overhauser-effect magnetometer, atomic magnetometer, optically pumped magnetometer.

Preferably, the magnetic sensor is a sensor of one of the following types: fluxgate, fluxset, electrical circuit in rotation or a scalar magnetometer polarized by a magnetic device.

Preferably, the north-seeking device is of one of the following types: GNSS, GPS, target pointing, celestial-body pointing, gyroscope, absolute-rotation detector, sunlight polarization.

Preferably, the observatory comprises a plurality of non-magnetic plinths, preferably made of concrete, the average dimensions [thickness, width, length] of which are comprised between [1, 10, 10] cm and [6, 10, 10] m; preferably, the average dimensions [thickness, width, length] are comprised between [10, 20, 20] cm and [1, 2, 2] m, even more preferably between [15, 25, 25] cm and [0.25, 0.5, 0.5] m, said plinths being separated by an average distance comprised between 0 and 10 m, preferably comprised between 1 and 6 m, and even more preferably between 2 and 4 m. The non-magnetic plinths support at least one of the following elements: the scalar magnetometer, the angular magnetometer, the variometer, the clock (201), the controller. Although the observatory is self-calibrated and can be installed anywhere on the Earth's crust, it is preferable to install it on a stable structure that is not subject to vibrations in order to obtain measurements of better quality. Preferably, the observatory comprises at least one non-magnetic shelter surrounding the plurality of plinths and comprising an insulated wall the average thickness of which is comprised between 1 and 60 cm, preferably between 2 and 30 cm, even more preferably between 5 and 10 cm. The at least one magnetic shelter protects at least one of the following elements: the scalar magnetometer (MS), the angular magnetometer (MA), the variometer (MV), the clock (201), the controller (202).

Just as the stable structure is important, limiting temperature variations improves the quality of the measurements and decreases the drift of the instruments.

According to a second aspect, the invention relates to a method for automatically obtaining the local magnetic field vector. This method comprises the step of providing a magnetic observatory such as described above. Next, the controller carries out the steps of acquiring values, of controlling the motors, of calculating values, of calibrating measurements and lastly of calculating the value of the local magnetic field vector.

Firstly, the controller acquires measurements of the modulus of said local magnetic field vector, which measurements are measured with the scalar magnetometer at different times ti, and it acquires measurements of the three mathematically independent components of the local magnetic field vector, dU, dV, dW, which measurements are measured with the variometer at the different times ti. Next, the controller controls the main motor in order to modify the horizontal orientation of the first orientable holder and, depending on the indications of the inclination sensor, measures the vertical direction, V; it also controls the secondary motor in order to modify the vertical orientation of the second orientable holder and, depending on the indications of the north-seeking device, measures the direction of geographic north N, and it controls the main and secondary motors in order to modify the horizontal and vertical orientations of the angular magnetometer and, depending on the indications of the magnetic sensor, which indications are obtained at the different times ti, measures two angles, D* and I*, corresponding to the direction of the local magnetic field vector. Thirdly, the controller calculates the absolute values of the two angles from the directions obtained beforehand such that: D=D*−N and I=I*−V; it also calculates baselines of the variometer at a time t, which is the average of the different times ti, using the absolute modulus of the local magnetic vector and the angles, all three obtained as described above. Fourthly, the controller calibrates the scale factors of each mathematically independent component of the variometer and it calibrates the orthogonality and the orientation in space of the three mathematically independent components of the variometer and calculates Eulerian rotation matrices. Lastly, the controller calculates the value of the local magnetic field vector by obtaining oriented measurements by applying Eulerian rotations to the three measurements of the variometer: dU, dV and dW, by obtaining measurements that are to scale by multiplying the three oriented measurements of the variometer by the respective scale factors and by obtaining the 3 components of the local magnetic field vector by adding the baselines to the three oriented and to-scale measurements.

The method described above allows a measurement of the local magnetic field to be obtained automatically and in a self-calibrated way. This automation makes it possible to no longer have to employ a qualified operator, this greatly decreasing cost and improving the precision of the measurements. The self-calibration allows the quality of the measurements to be improved. This self-calibration also participates in the decrease of cost because it permits the autonomous observatory to be installed in a structure that is inexpensive in comparison to conventional observatories. The combination of automation and of self-calibration therefore adds substantial value to the instruments considered separately.

Preferably, the measurement of the two angles, D* and I*, characterizing the direction of the field in the horizontal and vertical plane, respectively, is obtained by the controller by modifying the horizontal orientation of the first orientable holder (rotation of the holder in the horizontal plane) until the magnetic sensor indicates a zero, and acquiring the first angle D*, and by modifying the vertical orientation of the second orientable holder (rotation of the holder in the vertical plane) until the magnetic sensor indicates a zero, and acquiring the second angle I*.

Even more preferably, the measurement of the two angles, D* and I*, is obtained by the controller by modifying the horizontal orientation of the first orientable holder so that the magnetic sensor indicates a zero measurement value and acquiring the orientation D1 of the first orientable holder corresponding to this measurement, then by modifying the horizontal orientation of the first orientable holder by 180° and by adjusting the horizontal orientation so that the magnetic sensor indicates a zero measurement value and acquiring the orientation D2 of the first orientable holder corresponding to this measurement, then by modifying the vertical orientation of the second orientable holder by 180° and by adjusting the horizontal orientation of the first orientable holder so that the magnetic sensor indicates a zero measurement value and acquiring the orientation D3 of the first orientable holder corresponding to this measurement, then by modifying the horizontal orientation of the first orientable holder by 180° and by adjusting the horizontal orientation so that the magnetic sensor indicates a zero measurement value and acquiring the orientation D4 of the first orientable holder corresponding to this measurement, and lastly by calculating the first angle corresponding to the horizontal direction of the local magnetic field by calculating the average of the four measurements: D*=(D1+D2+D3+D4)/4.

Similarly, the measurement of I* is obtained by modifying the horizontal orientation of the first orientable holder to the direction D*−90°, then by carrying out the same three first steps as for D*, in which steps the horizontal and vertical orientations are inverted and in which steps the roles of the first and second orientable holders are inverted, and thus acquiring the orientations I1, I2, I3. I4 by modifying the horizontal orientation of the first orientable holder to the direction D*−90° and by adjusting the vertical orientation of the second orientable holder so that the magnetic sensor indicates a zero measurement value, the orientation I4 of the second orientable holder corresponding to this measurement. Lastly, the second angle corresponding to the second direction of the local magnetic field in the vertical plane is calculated by calculating the average of the four measurements: I*=(I1+I2+I3+I4)/4.

Preferably, the north-seeking device is a seeker of the absolute-rotation-detector type and the controller controls the secondary motor in order to modify the vertical orientation of the second orientable holder and, depending on the indications of the north-seeking device, measures the direction of geographic north N by modifying the horizontal orientation of the first orientable holder until the absolute-rotation detector indicates a zero measurement value and acquires the orientation N of the first orientable holder corresponding to this measurement.

Even more preferably, the measurement of the direction of geographic north N is obtained similarly to D*, the magnetic sensor being replaced by the absolute-rotation detector and the orientations D1, D2, D3, D4 and D* being replaced by N1, N2, N3, N4 and N in the method described above.

These measuring methods have the advantage of cancelling out all the internal alignment errors of the instrument and therefore improve the quality of the measurements.

Preferably, the controller calculates the baselines of the variometer on the basis of the three measurements of the variometer: dU, dV, and dW, of the absolute modulus of the local magnetic field vector F, of the two angles characterizing the direction of the local magnetic field vector ($\vec{F}$): the inclination I and the declination D, and, optionally of functions gU, gV, gW allowing a change of coordinates D, F, I to coordinates U, V, W, to be achieved. The controller calculates the baselines U0, V0, W0, using:

$$U_0 = g_U(F,D,I) - dU$$

$$V_0 = g_V(F,D,I) - dV$$

$$W_0 = g_W(F,D,I) - dW.$$

Preferably, the controller calibrates the scale factors of each component of the variometer by measuring the amplitudes of the variations in the baselines with respect to the amplitudes of the signals of each of the three components of the local magnetic field vector ($\vec{F}$) during a preestablished length of time, then by multiplying the three measurements of the variometer (MV): dU, dV, and dW by correctional factors, the scale factors, $f_U$, $f_V$, $f_W$, then by subtracting the corrected values and calculating the baselines using:

$$U_0 = g_U(F,D,I) - f_U * dU$$

$$V_0 = g_V(F,D,I) - f_V * dV$$

$$W_0 = g_W(F,D,I) - f_W * dW$$

Next, the controller increases or decreases the respective scale factors in order to decrease the variations in the respective baselines and it corrects the measurements of the variometer by multiplying by the respective scale factors. These steps may be repeated iteratively until the increase or decrease in the scale factors is smaller than a preset value.

Preferably, the controller calibrates the orthogonality and the orientation in space of the three mathematically independent components of the variometer and calculates the Eulerian rotation matrices E by examining the variation in the baseline of a component as a function of the amplitude of the signal of the other components during a preset length of time, by calculating the Eulerian rotation matrices E and by adjusting the orientations until the variation in the baseline is smaller than a preset value.

Preferably, the scalar magnetometer and the variometer carry out measurements with a frequency comprised between 0.01 Hz and 100 Hz, preferably between 0.05 Hz and 10 Hz, and even more preferably between 0.1 Hz and 1 Hz.

Preferably, the measurements of the orientations of the local magnetic field vector are carried out with a frequency comprised between $10^{-7}$ Hz and $10^{-2}$ Hz, preferably between $10^{-6}$ Hz and $10^{-3}$ Hz, and even more preferably between $10^{-5}$ Hz and $10^{-4}$ Hz.

Preferably, the autonomous observatory implements a method such as described above.

BRIEF DESCRIPTION OF THE DRAWINGS

These aspects and other aspects of the invention will be clarified in the detailed description of particular embodiments of the invention, reference being made to the drawings of the figures, in which.

The drawings of the figures are not to scale. Generally, similar elements have been referenced with similar references in the figures. The presence of reference numbers in the drawings cannot be considered to be limiting, including when these numbers are indicated in the claims.

DETAILED DESCRIPTION OF CERTAIN EMBODIMENTS OF THE INVENTION

Figure 1:
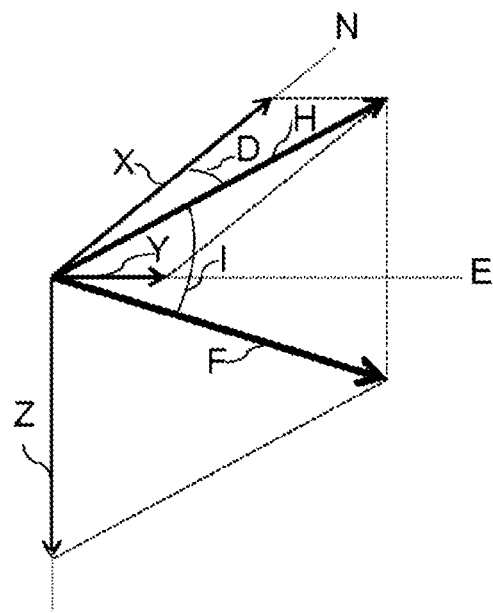
FIG. 1 shows a local magnetic field vector and its decomposition into various mathematically independent components.

FIG. 1 shows an example of a local terrestrial magnetic field vector, referred to as the local magnetic field vector $\vec{F}$ below, and its decomposition into various mathematically independent components. Since the local magnetic field $\vec{F}$ is a vector field, knowledge of its magnitude is not enough to completely characterize it. Specifically, it is necessary to define its orientation with respect to reference directions. These reference directions are preferably the local vertical (or, equivalently, a horizontal plane) and the direction of geographic north N. The magnetic declination "D" is then defined as being the angle between the geographic north N and the projection of the magnetic vector into a horizontal plane. The magnetic inclination "I" is defined as being the angle between the horizontal plane and the magnetic vector in a vertical plane containing this vector.

In Cartesian coordinates, XYZ, X points toward geographic north N, Y toward geographic east E, and Z vertically downwards. In cylindrical coordinates, HDZ, H is the horizontal component, D the magnetic declination and Z the vertical component (positive in the downward direction). In spherical coordinates, FDI, F is the modulus of the local magnetic field vector (magnitude of the vector), D the magnetic declination and I the magnetic inclination. Whatever the coordinate system chosen, three mathematically independent components must be determined to completely characterize the local magnetic field vector $\vec{F}$. It will lastly be noted that the following relationships exist between the various values: H=F cos I, Z=F sin I, X=H cos D, Y=H sin D.

Figure 2:
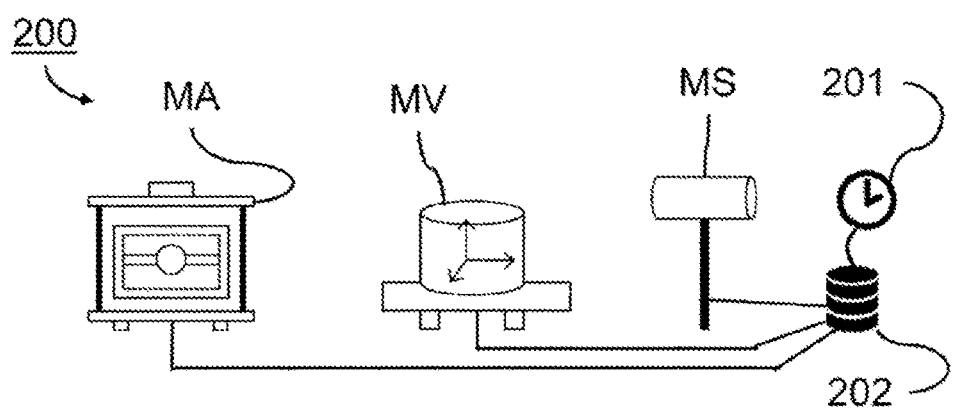
FIG. 2 shows an example of an autonomous magnetic observatory according to the invention.

FIG. 2 shows an example of an autonomous magnetic observatory 200 according to the invention. Preferably, this observatory 200 comprises: a scalar magnetometer MS, an angular magnetometer MA, a variometer MV, a clock 201, and a controller 202.

Preferably, the scalar magnetometer MS is used to measure the strength of the magnetic field, or in other words to measure the modulus of the local magnetic field vector F. The scalar magnetometer may be qualified an absolute instrument in so far as it measures a quantity that is not relative to another. The term scalar designates a property that remains unchanged during a change of reference system. The scalar magnetometer MS is, for example, a magnetometer of one of the following types: proton magnetometer, Overhauser-effect magnetometer, atomic magnetometer, optically pumped magnetometer. Preferably, the measurements of the modulus of the local magnetic field vector F are carried out with a frequency comprised between 0.01 Hz and 100 Hz, preferably between 0.05 Hz and 10 Hz, and even more preferably between 0.1 Hz and 1 Hz. Preferably, the precision of the measurements is such that the measurement error is smaller than 1 nT, even more preferably smaller than 0.5 nT, and ideally smaller than 0.2 nT.

Since the local magnetic field $\vec{F}$ varies in time, a clock 201 allowing a time reference to be defined is used to synchronize the measurements of the various instruments. This clock is, for example, an Internet time server, an atomic clock or a GNSS signal. The greater the variation in the field as a function of time, the better the synchronization of the measurements must be.

Figure 3:
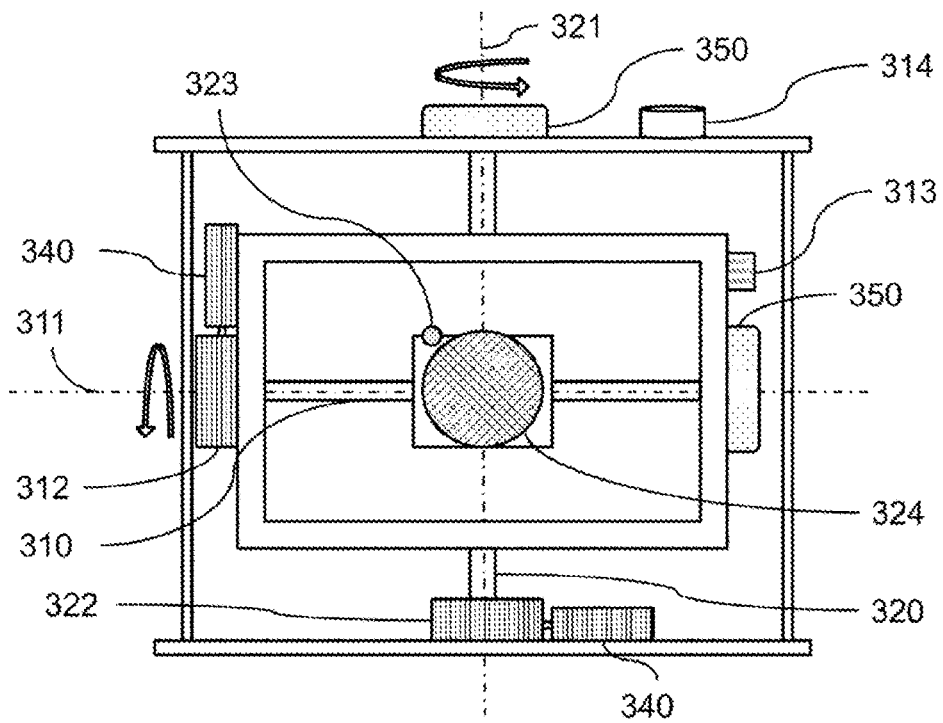
FIG. 3 shows an example of an embodiment of an angular magnetometer according to the invention.

FIG. 3 shows an example of an embodiment of an angular magnetometer MA according to the invention. The angular magnetometer allows the direction of the local magnetic field vector $\hat{F}$ to be determined.

In the example of FIG. 3, the angular magnetometer MA comprises:
- a first holder 320 that is orientable about a first axis of rotation, called the main axis 321;
- a second holder 310 that is orientable about a second axis of rotation called the secondary axis 311, essentially orthogonal to the main axis;
- an inclination sensor 313;
- a north-seeking device 324;
- a magnetic sensor 323 for measuring the direction of the local magnetic field vector $\hat{F}$.

Preferably, the first holder comprises: a main motor 322 for modifying the orientation of the first orientable holder 320 about the main axis, the inclination sensor 313, the second orientable holder 310. The two axes of rotation) 321 and 311, allow a movement in two essentially orthogonal (horizontal and vertical) planes. These movements allow a horizontal orientation of the first orientable holder and a vertical orientation of the second orientable holder to be obtained. Preferably, the second orientable holder 310 comprises a secondary motor 312 for modifying the orientation of the second orientable holder about the secondary axis 311, a magnetic sensor 323 for measuring the direction of the local magnetic field vector $\hat{F}$ and a north-seeking device 324. Preferably, the angular magnetometer MA also comprises a means 340 for controlling the main motor 322 and secondary motor 312 and a device 350 for angularly measuring and acquiring the horizontal and vertical orientations of the first and second orientable holders 320, 310. Preferably, the angular magnetometer possesses two degrees of freedom in rotation, and is able to orient the magnetic sensor 323 in an arbitrary direction. In particular, it is capable of orienting the magnetic sensor depending on the magnetic field.

Preferably, the main motor 322 and secondary motor 312 have a negligible magnetic footprint so that they do not perturb the measurement of the magnetic field. For example, these motors are piezoelectric motors.

The angularly measuring and angularly acquiring device 350 allows an angle of rotation of the first and second orientable holders 320 and 310 to be measured about each of the main axis 321 and secondary axis 311, respectively. This device is, for example, an optical encoder. This device may be used as return signal for an automatically controlled angular movement.

Preferably, the position of the main axis 321 may be adjusted using "levelling" screws. Other solutions are possible such as a universal joint, a ball joint or a pendulum-type suspended system.

The inclination sensor 313 measures the orientation of the main axis 321 with respect to the vertical. The inclination sensor allows a first reference direction to be obtained. This sensor is, for example, an electrolytic level or a gravitymeasuring accelerometer. Preferably, the inclination sensor is securely fastened to the frame of reference that turns with the secondary axis 311 and hence securely fastened to the north-seeking device 324 and to the magnetic sensor 323. The inclination sensor may also be placed in a frame of reference that is attached to the main axis 321.

In an improved version of the device, the angular magnetometer MA furthermore comprises an auxiliary inclination sensor 314 that is able to be installed in the fixed portion of the instrument. Preferably, the auxiliary inclination sensor has two degrees of freedom.

The angular magnetometer MA comprises a north-seeking device 324. This north-seeking device allows the direction of geographic north N to be determined and thus a second reference direction to be determined. Preferably, the north-seeking device benefits from two degrees of freedom, i.e. it may make rotations about the main axis 321 and secondary axis 311.

Figure 4:
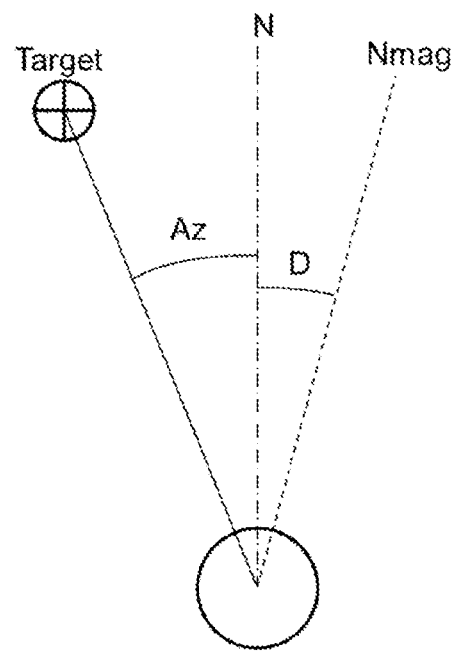
FIG. 4 shows an example of a north-seeking device based on a target-pointing principal.

The north-seeking device 324 is, for example, a target-pointing system such as shown in FIG. 4. Such a device is pointed in a direction, Target, the angle, Az, of which with respect to geographic north N is known beforehand. The direction of geographic north N is thus deduced therefrom. Such a device may be a laser that is pointed at a retroreflector. The return beam is then captured by a device such as a photocell or a PSD (position sensitive detector). Other solutions are also possible such as a CCD camera. GPS or GNSS beacons may also serve as target. FIG. 4 also illustrates the direction of magnetic north Nmag, and the declination angle D.

Figure 5:
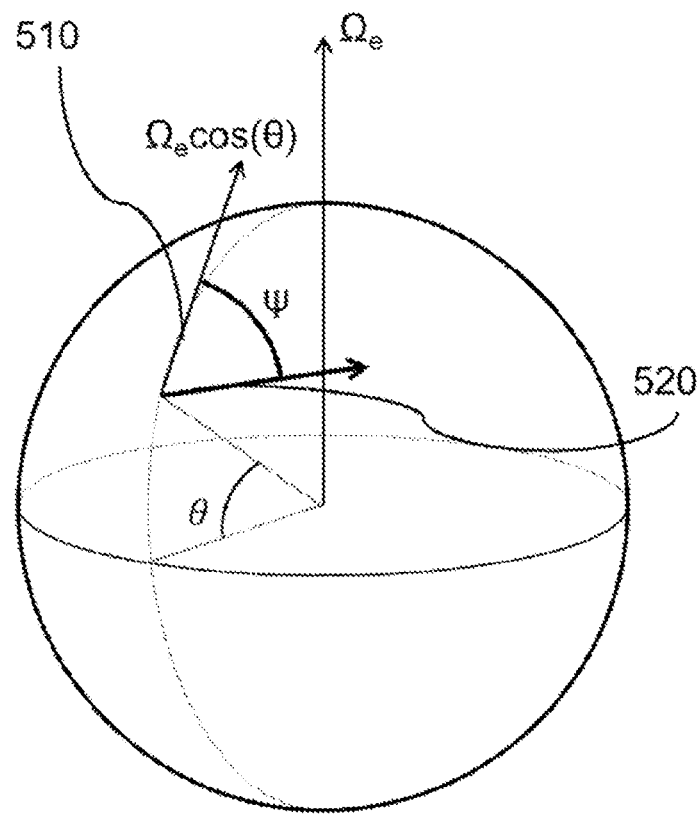
FIG. 5 shows an example of a north-seeking device based on an absolute-rotation-detector principle.

Alternatively, the north-seeking device 324 may be a sun-pointing (sunshot) device: it is possible to derive the direction of geographic north N by pointing such a device at the sun at a given time (irrespectively of whether the sun is hidden by clouds, for example by virtue of polarizing filters). Known methods require knowledge of sidereal time, of the declination and of the right ascension of the sun. These data are available in astronomical tables or derived from models. Other devices may also be used such as a celestial-body-targeting device: the preceding principle may be applied to any other visible celestial body. A star camera: in a fixed coordinate system with respect to the observatory, the stars do not appear to be fixed in the sky. An image of them at a given time then allows the direction of geographic north N to be determined. Advantageously, the north-seeking device 324 is an absolute-rotation detector such as shown in FIG. 5. This type of sensor is capable of detecting the Earth's rotation $\Omega_e$. This detector measures the projection of the horizontal component 510 of the terrestrial rotation vector onto its sensing axis 520. FIG. 5 shows an example of a projection for a latitude 8, and an angle L of orientation of the sensing axis measured with respect to geographic north N (not shown). These two directions are located in the same horizontal plane. If this sensing axis is moved in a horizontal plane, its output describes a sinusoid the maximums of which are located in the north-south direction and the zeros of which in the east-west direction.

These sensors or gyroscopes may in particular be of mechanical type) of optical-fiber (FOG) type, of laser (RLG) type, of hemispherical-resonance (HRG) type, of MEMS type or of atomic type.

Figure 6:
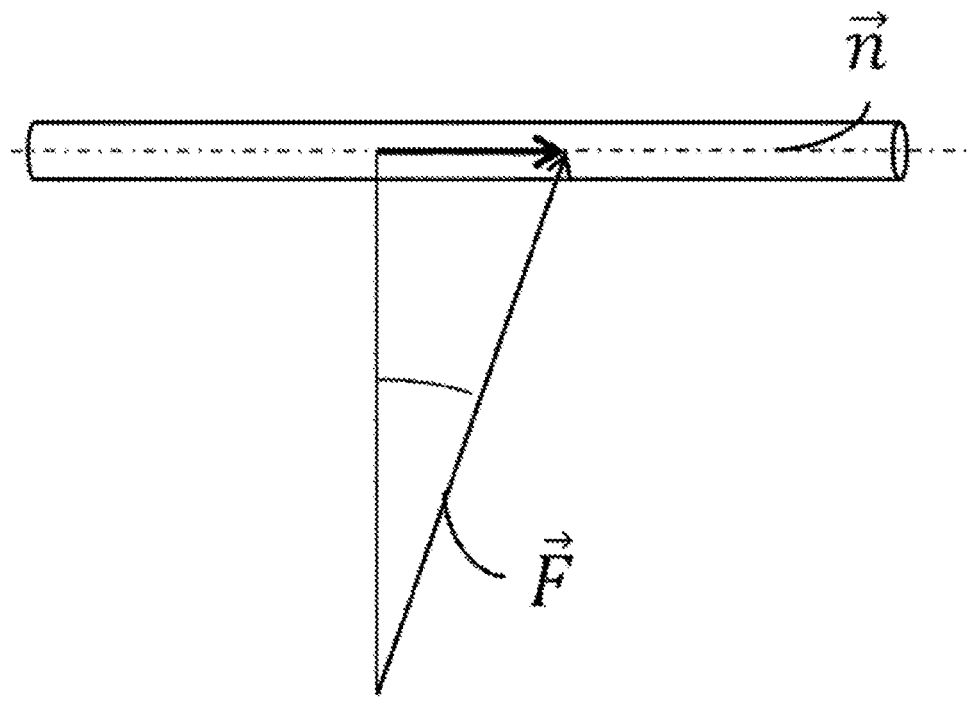
FIG. 6 shows an example of an orientation of the sensing axis of a magnetic sensor with respect to the local magnetic field.

The magnetic sensor 323 is a directional magnetic-field sensor the sensing axis of which may be oriented about the main axis 321 of rotation and the secondary axis 311 of rotation of the angular magnetometer MA. This magnetic sensor may, for example, be a fluxgate, a fluxset, an electrical circuit in rotation or a scalar magnetometer polarized by a magnetic device. The output T of this magnetic sensor 323 is proportional to the scalar product of the local magnetic field $\vec{F}$ multiplied by a unit vector $\vec{n}$ parallel to its sensing axis (see FIG. 6): $T = k(\vec{n} \cdot \vec{F})$, where k is a proportionality factor or scale factor of the magnetic sensor.

The magnetic sensor 323 may be capable of measuring the strength of the magnetic field (scalar measurement). The scalar magnetometer MS may therefore be comprised in the angular magnetometer MA. Such a sensor may be a single- or three-axis full-field fluxgate probe, a three-axis fluxset probe, or a scalar magnetometer. The scalar measurement may also be carried out by an auxiliary magnetic sensor included in the instrument. Preferably, the measurements of the orientation of the local magnetic field vector are carried out with a frequency comprised between $10^{-7}$ Hz and $10^{-2}$ Hz, preferably between $10^{-6}$ Hz and $10^{-3}$ Hz, and even more preferably between $10^{-5}$ Hz and $10^{-4}$ Hz. Preferably, the precision of the angular measurements in the horizontal plane is such that the measurement error is smaller than 20 arc seconds, even more preferably smaller than 10 arc seconds, and ideally smaller than 6 arc seconds. Preferably, the precision of the angular measurements in the vertical plane is such that the measurement error is smaller than 10 arc seconds, even more preferably smaller than 5 arc seconds, and ideally smaller than 1 arc second.

The variometer MV, also called a vector magnetometer, measures the variations in three mathematically independent components of the local magnetic field $\vec{F}$ at regular intervals. Preferably, these measurements of three mathematically independent components of the local magnetic field $\vec{F}$ are carried out with a frequency comprised between 0.01 Hz and 100 Hz, preferably between 0.05 Hz and 10 Hz, and even more preferably between 0.1 Hz and 1 Hz. Preferably, the precision of the measurements is such that the measurement error is smaller than 2 nT, and even more preferably smaller than 1 nT, and ideally smaller than 0.5 nT. These measurements are more precise than the absolute measurements carried out with the angular and scalar magnetometers but they must be calibrated with respect to a reference. The variometer MV and the scalar magnetometer MS may be grouped together in one and the same instrument.

The autonomous observatory also comprises a controller 202. This controller is configured to:
a) automatically control the main motor 322 and secondary motor 312;
b) manage the orientation of the:
  1) inclination sensor 313 for measuring the direction of the vertical V;
  2) north-seeking device 324 for measuring the direction of geographic north N;
  3) magnetic sensor 323 for measuring the direction of the local magnetic field vector $\vec{F}$;
c) acquire:
  1) the angles of the direction of the local magnetic field vector $\vec{F}$ with respect to geographic north N and to the vertical V depending on the horizontal and vertical orientations of the first and second orientable holders;
  2) the three variations in the local magnetic field vector $\vec{F}$ that are measured by the variometer MV;
  3) the values of the modulus of the local magnetic field vector F that are measured by the scalar magnetometer MS;

d) process the data acquired in step c) in order to automatically obtain the local magnetic field vector $\vec{F}$ and the errors in the measurements associated with each instrument.

Preferably, the first and second orientable holders 320 and 310, the main motor 322 and secondary motor 312, the north-seeking device 324, the means for controlling the motors 340, and the angularly measuring and acquiring device 350 are formed from non-magnetic components, i.e. the magnetic susceptibility of the materials from which they are formed is comprised between −1 and 1, preferably between $-10^{-1}$ and $10^{-1}$, and even more preferably between $-10^{-3}$ and $10^{-3}$. For example, the materials are materials chosen from: ceramic, aluminum, arcap, titanium, copper, ertalon, nylon, ertacetal, peek.

Figure 7:
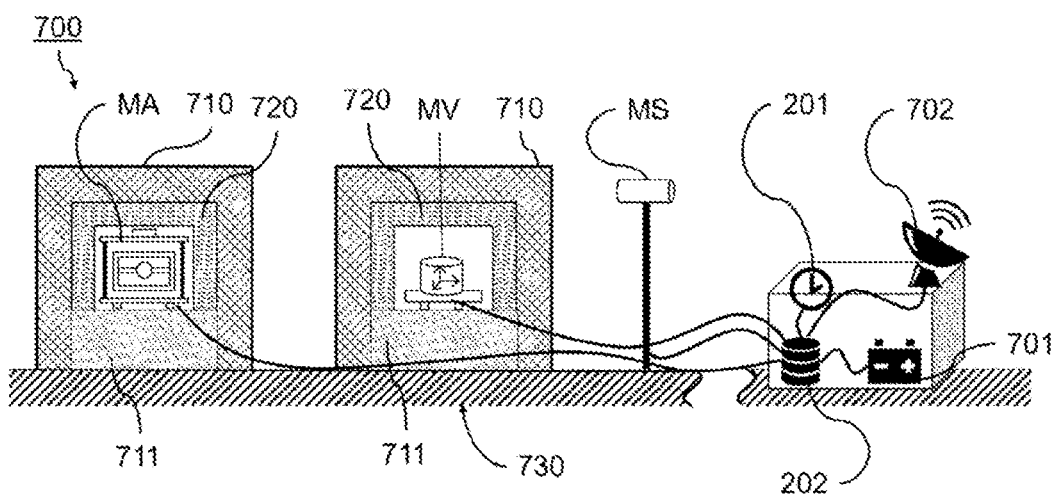
FIG. 7 shows a second example of an autonomous magnetic observatory according to the invention.

FIG. 7 shows a second example of an autonomous magnetic observatory 700 according to the invention. In this example, the autonomous magnetic observatory comprises an angular magnetometer MA, a scalar magnetometer MS, a variometer MV, a clock 201, a controller 202 such as described above. The observatory 700 furthermore comprises a power source 701, and the controller 202 is furthermore capable of acquiring and transferring data from the instruments (MA, MS, MV) to an exterior network via a communication system 702. Preferably, the magnetometers are located away from the various electronics in order not to be perturbed thereby. The angular magnetometer MA and the variometer MV may be inserted into insulating chambers of high thermal inertia. A "sandwich" structure may also be envisioned. The angular magnetometer MA and the variometer MV may also be installed on a stable holder such as a plinth anchored on a solid base 730. The base may be rock or a slab composed of a magnetic materials. In the example of FIG. 7, two non-magnetic shelters 710 surround a plurality of plinths 711 and comprise an insulated wall 720 the average thickness of which is comprised between 1 and 60 cm, preferably, between 2 and 30 cm, and even more preferably between 5 and 10 cm. Preferably, the plurality of non-magnetic plinths, which are preferably made of concrete, have average dimensions [thickness, width, length] that are comprised between [1, 10, 10] cm and [6, 10, 10] m; preferably, the average dimensions [thickness, width, length] are comprised between [10, 20, 20] cm and [1, 2, 2] m, and even more preferably between [15, 25, 25] cm and [0.25, 0.5, 0.5] m, said plinths being separated by an average distance comprised between 0 and 10 m, preferably comprised between 1 and 6 m, and even more preferably between 2 and 4 m. In this example, one of the shelters 710 comprises the vector magnetometer MV and the other the angular magnetometer MA. Preferably, the observatory comprises a single shelter 710.

Preferably, the non-magnetic plinths 711 support at least one of the following elements: the scalar magnetometer MS, the angular magnetometer MA, the variometer MV, the clock 201, the controller 202. Preferably, the non-magnetic shelter protects at least one of the following elements: the scalar magnetometer MS, the angular magnetometer MA, the variometer MV, the clock 201, the controller 202.

The autonomous magnetic observatory according to the invention may be installed on the ground or underwater, for example at the bottom of the sea. When it is submerged, the instruments (MA, MS, MV), the clock 201 and the controller 202 are protected by one or more seal-tight protective housings. The instruments (MA, MS, MV), the clock 201 and the controller 202 are installed in a single housing, or, preferably, in separate housings. The one or more housings prevent exterior water from damaging or destroying their content. For example, an underwater magnetic observatory may be supplied with electricity via batteries, an underwater cable, a surface buoy connected to the observatory by a conductive cable, a generator that generates electricity from marine current.

According to a second aspect, the invention relates to a method for obtaining the local magnetic field vector $\vec{F}$.

Figure 8:
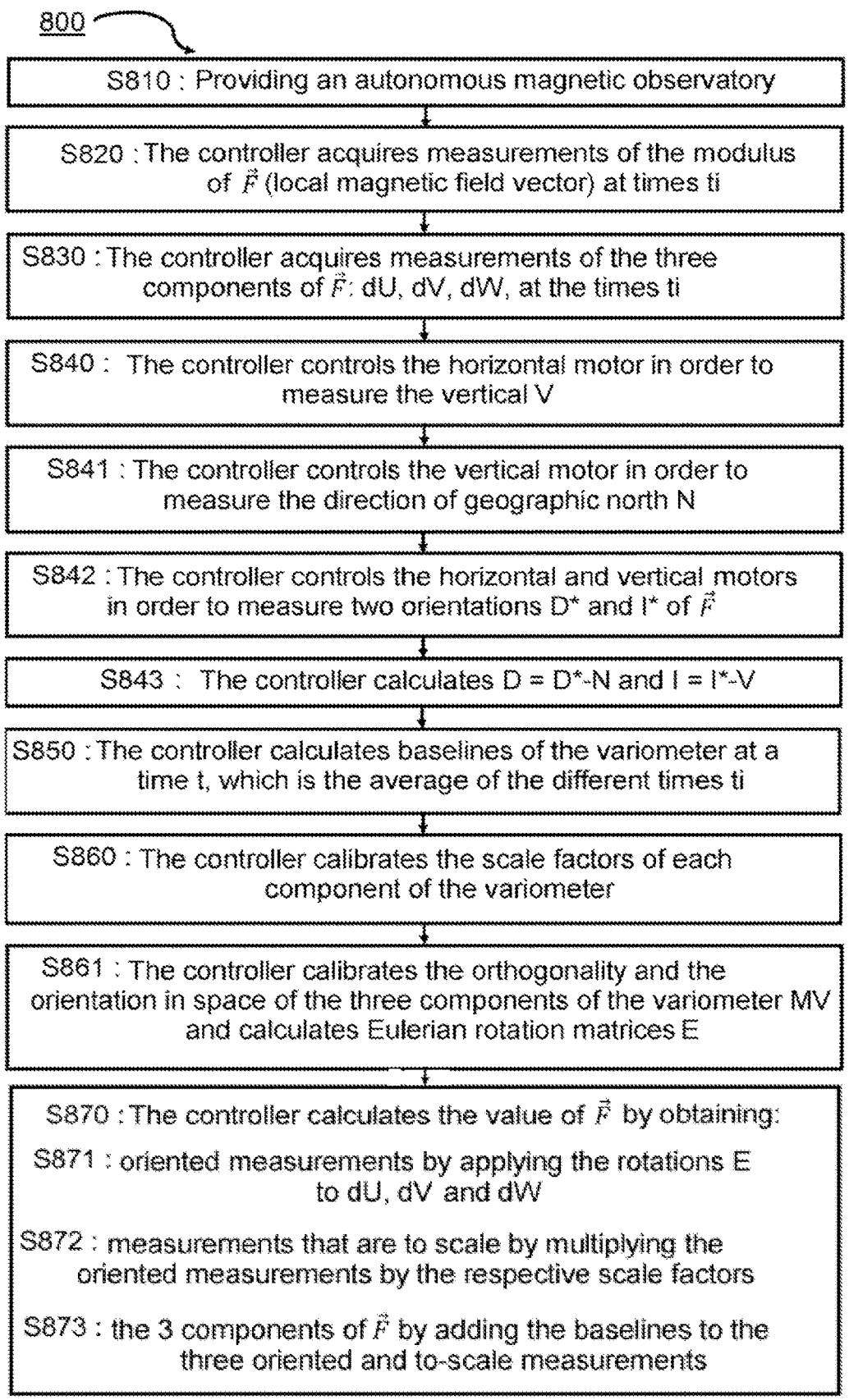
FIG. 8 shows a chart of an example of a method for obtaining the local magnetic field vector according to the invention.

FIG. 8 shows a chart of an example of a method 800 for obtaining the local magnetic field vector $\vec{F}$ according to the invention. This method comprises the steps:
- a) S810: providing a magnetic observatory such as described above;
- b) S820: the controller 202 acquires measurements of the modulus of the local magnetic field vector, F, which measurements are measured with the scalar magnetometer MS at different times ti;
- c) S830: the controller acquires measurements of the three mathematically independent components of the local magnetic field vector $\vec{F}$, dU, dV, dW, which measurements are measured with the variometer MV at the different times ti;
- d) S840: the controller controls the main motor 322 in order to modify the horizontal orientation of the first orientable holder 320 and, depending on the indications of the inclination sensor, measures the vertical, V;
- e) S841: the controller controls the secondary motor 312 in order to modify the vertical orientation of the second orientable holder 310 and, depending on the indications of the north-seeking device 324, measures the direction of geographic north N;
- f) S842: the controller controls the main and secondary motors in order to modify the horizontal and vertical orientations of the angular magnetometer MA and, depending on the indications of the magnetic sensor 323, which indications are obtained at the different times ti, measures two angles, D* and I*, corresponding to the direction of the local magnetic field vector $\vec{F}$;
- g) S843: the controller calculates the absolute values of the two angles from the directions obtained in steps d) to f), such that: D=D*−N and I=I*−V;
- h) S850: the controller calculates baselines of the variometer MV at a time t, which is the average of the different times ti, using the absolute modulus of the local magnetic vector F, obtained as in step b) and the angles obtained as in step g);
- i) S860: the controller calibrates the scale factors of each mathematically independent component of the variometer MV;
- j) S861: the controller calibrates the orthogonality and the orientation in space of the three mathematically independent components of the variometer MV and calculates Eulerian rotation matrices E;
- k) S870: the controller calculates the value of the local magnetic field vector $\vec{F}$ by carrying out the steps of:
  1) S871: obtaining oriented measurements by applying the Eulerian rotations E, which were obtained in step j), to the three measurements of the variometer MV: dU, dV, and dW;
  2) S872: obtaining measurements that are to scale by multiplying the three oriented measurements of the variometer MV by the respective scale factors obtained in step i);

3) S873: obtaining the 3 components of the local magnetic field vector $\vec{F}$ by adding the baselines to the three oriented and to-scale measurements.

The local magnetic field vector $\vec{F}$ varies in time, which is why it is necessary to carry out the measurements at various times ti.

The scalar magnetometer MS is an instrument capable of delivering the value of the modulus of the local magnetic field F with a precision such that the measurement error is generally smaller than 1 nT, preferably smaller than 0.5 nT, and ideally smaller than 0.2 nT. The controller 202 of the autonomous observatory is configured to acquire the values delivered by the scalar magnetometer MS.

Preferably, the controller 202 controls the main motor 322 and secondary motor 312 in order to measure the vertical direction V using the inclination sensor. The controller is also configured to control the main motor 322 and secondary motor 312 in order to measure the direction of geographic north N using the north-seeking device 324.

Preferably, the north-seeking device 324 is an absolute-rotation detector and the search for geographic north N consists in modifying the horizontal orientation of the first orientable holder 320 until the absolute-rotation detector indicates a zero measurement value. The controller 202 then acquires the orientation of the first holder indicating geographic north N.

Alternatively, the north-seeking device is an absolute-rotation detector and the search for geographic north N comprises the steps:
   a) modifying the horizontal orientation of the first orientable holder 320 so that the absolute-rotation detector indicates a zero measurement value and acquiring the orientation N1 of the first orientable holder corresponding to this measurement;
   b) modifying the horizontal orientation of the first orientable holder 320 by 180° and adjusting the horizontal orientation so that the absolute-rotation detector indicates a zero measurement value and acquiring the orientation N2 of the first orientable holder corresponding to this measurement;
   c) modifying the vertical orientation of the second orientable holder 310 by 180° and adjusting the horizontal orientation of the first orientable holder 320 so that the absolute-rotation detector indicates a zero measurement value and acquiring the orientation N3 of the first orientable holder 320 corresponding to this measurement;
   d) modifying the horizontal orientation of the first orientable holder 320 by 180° and adjusting the horizontal orientation so that the absolute-rotation detector indicates a zero measurement value and acquiring the orientation N4 of the first orientable holder corresponding to this measurement;
   e) calculating the direction of geographic north N by calculating the average of the four measurements: N=(N1+N2+N3+N4)/4.

The measurement of geographic north N and of the vertical V allows a reference coordinate system in which the local magnetic field vector $\vec{F}$ will be expressed to be defined.

Once the direction of geographic north N and of the vertical V is known, a local frame of reference is obtained in which two orientations of the local magnetic field vector $\vec{F}$, which are determined by the controller 202 using the angular magnetometer MA and its magnetic sensor 323, are expressed. Preferably, the magnetic sensor 323 of the angular magnetometer MA is a directional sensor such that only a component of the local magnetic field that is parallel to the sensing axis of the sensor is measured. The output of the sensor is then given by the following scalar product: $T = k(\vec{n} \cdot \vec{F})$, where T is the output of the sensor, which is conventionally expressed in nanotesla (nT), k is a scale factor of the sensor, $\vec{n}$ is a unit vector parallel to the sensing axis of the sensor and $\vec{F}$ is the local magnetic field vector. For example, an orientation of the magnetic sensor 323 normal to the magnetic field leads to a scalar product of zero. The zero or null method is thus spoken of. The controller 202 is therefore configured to measure the two angles, D* and I*, by modifying the horizontal orientation of the first orientable holder 320 until the magnetic sensor indicates a minimum value that is ideally a zero, this giving a first orientation D*. The controller then modifies the vertical orientation of the second orientable holder 310 until the magnetic sensor indicates a minimum value that is ideally a zero, this giving a second orientation I*.

Preferably, a plurality of zeros are measured with the aim of decreasing measurement errors and certain errors due to the instruments. Generally, the magnetic-field component measured by the magnetic sensor 323 may be expressed as a function of two degrees of freedom and various alignment errors using Lauridsen's model, which is known to those skilled in the art (Lauridsen, K. E., 1985. Experiences with the DI-fluxgate magnetometer inclusive theory of the instrument and comparison with other methods. Danish Meteorological Institute Geophysical Papers, R-71):

$$T = H \cos(\alpha - D)(\cos(\beta) - \in \sin(\beta)) - \gamma H \sin(\alpha - D) + Z(\in \cos(\beta) + \sin(\beta)) + T_0$$

with: T: the output of the magnetic sensor 323, T0: an optional offset, H: the horizontal component (in the plane perpendicular to the main axis 321) of the local magnetic field vector $\vec{F}$, Z: the vertical component (parallel to the main axis) of the local magnetic field vector $\vec{F}$, D: the magnetic declination, α: angle of the angular magnetometer MA in the horizontal plane with respect to geographic north, β: angle in the vertical plane with respect to vertical, ∈: alignment error of the magnetic sensor 323 with respect to its sensing axis in a vertical plane, γ: alignment error of the magnetic sensor with respect to its sensing axis in the horizontal plane when the sensing axis is horizontal. The angular directions of the magnetic field are then determined by seeking magnetic-center orientations that are essentially perpendicular to the magnetic field. Known methods (Lauridsen, Kerridge: Kerridge, D. J. (1988). Theory of the fluxgate-theodolite. British Geological Survey Technical Report, Geomagnetism Series, WW/88/14) make it possible to compensate for the alignment and offset errors of the sensor.

For example, the controller 202 controls the main and secondary motors in order to modify the horizontal and vertical orientations of the angular magnetometer MA and searches for zeros corresponding to 4 orientations (+/−180° in the horizontal and +/−180° in the vertical). For example, to find the declination D, the controller carries out the steps:
   a) modifying the horizontal orientation of the first orientable holder 320 so that the magnetic sensor 323 indicates a zero measurement value and acquiring the orientation D1 of the first orientable holder corresponding to this measurement;
   b) modifying the horizontal orientation of the first orientable holder 320 by 180° and adjusting the horizontal orientation so that the magnetic sensor 323 indicates a zero measurement value and acquiring the orientation D2 of the first orientable holder corresponding to this measurement;

c) modifying the vertical orientation of the second orientable holder 310 by 180° and adjusting the horizontal orientation of the first orientable holder 320 so that the magnetic sensor 323 indicates a zero measurement value and acquiring the orientation D3 of the first orientable holder corresponding to this measurement;

d) modifying the horizontal orientation of the first orientable holder 320 by 180° and adjusting the horizontal orientation so that the magnetic sensor 323 indicates a zero measurement value and acquiring the orientation D4 of the first orientable holder corresponding to this measurement;

e) calculating the first angle corresponding to the horizontal direction of the local magnetic field by calculating the average of the four measurements: D*=(D1+D2+D3+D4)/4; Similarly, the controller 202 obtains the inclination I by carrying out the steps:

f) modifying the horizontal orientation of the first orientable holder 320 to the direction D*−90°;

g) carrying out steps a) to c) in which the horizontal and vertical orientations are inverted and in which the roles of the first and second orientable holders 320, 310 are inverted, and thus acquiring the orientations I1, I2, I3;

h) modifying the horizontal orientation of the first orientable holder 320 to the direction D*−90° and adjusting the vertical orientation of the second orientable holder 310 so that the magnetic sensor 323 indicates a zero measurement value and acquiring the orientation I4 of the second orientable holder corresponding to this measurement;

i) calculating the second angle corresponding to the second direction of the local magnetic field by calculating the average of the four measurements: I*=(I1+I2+I3+I4)/4.

Alternatively, a second method consists in searching for a direction in which the magnetic sensor 323 indicates a measurement value that is close to zero but that has a residue dT. The components of the local magnetic field the orientations of which are being sought may be converted using the following relationships:

$$\delta D = \frac{180}{\pi}\mathrm{asin}\left(\frac{dT}{H}\right)$$

$$\delta I = \frac{180}{\pi}\mathrm{asin}\left(\frac{dT}{F}\right)$$

where H is the magnitude of the horizontal component of the local magnetic field vector $\vec{F}$ and F the modulus of the local magnetic field vector. Each measurement is then corrected for its residue.

The orientations D and I are then calculated by the controller 202 in the frame of reference of geographic north N and of the vertical such that: D=D*−N and I=I*−V.

The controller 202 acquires the values of the three components of the local magnetic field vector $\vec{F}$: dU, dV, dW, which values are measured with the variometer MV at the different times ti. In a magnetic observatory, the measurement of the magnetic field is preferably also carried out by means of a vector magnetometer, also called a variometer MV, which measures the variations in the three components of the magnetic field at regular intervals (e.g. 10 Hz, 1 Hz, 0.05 Hz). It is a question of relative measurements with respect to a reference. These measurements must therefore be calibrated using absolute measurements delivered by an angular magnetometer MA and a scalar magnetometer MS.

The values of the three components of the local magnetic field vector $\vec{F}$: dU, dV, dW, which values are measured with the variometer MV are variations in the components about a reference value. This reference value, generally called the "baseline" LDB, is determined by subtracting the variation as a function of time in the component from its "absolute" or complete value. The variation as a function of time is the relative value of the component measured by the variometer MV. For a component C, the relationship is: $C_0$=C(t)−δC(t), with: $C_0$: the LDB of a component C, which is assumed to be independent of time, C(t): the "absolute" value of C at the time t (which value is determined from the absolute measurements of the angular magnetometer MA and of the scalar magnetometer MS) and δC(t): the variation in C at the time t, which variation is measured by the variometer MV. The calculation of the baselines of the variometer MV at a time t, which is the average of the different times ti, is therefore obtained using the absolute modulus of the local magnetic vector F and the angles D and I.

The LDB value depends only on the implementation of the MV and not on the magnetic field itself. However, this value may vary in time under the effect, for example, of temperature. Regular absolute measurements then allow it to be adjusted. The calculation of the LDBs may also involve a change of coordinates, for example from coordinates D, F, I to any other set of coordinates U, V, W. The controller 202 then calculates the baselines of the variometer MV on the basis of the three measurements of the variometer MV: dU, dV, and dW, of the absolute modulus of the local magnetic field vector F, of the two angles characterizing the direction of the local magnetic field vector $\vec{F}$: the inclination I and the declination D, and, of functions gu, gv, gw allowing a change of coordinates D, F, I to coordinates U, V, W, to be achieved. The controller calculates the baselines $U_0$, $V_0$, $W_0$, using:

$$U_0 = g_U(F,D,I) - dU$$

$$V_0 = g_V(F,D,I) - dV$$

$$W_0 = g_W(F,D,I) - dW.$$

The variometer MV may also exhibit scale-factor errors (one per component) that must be calibrated by the controller 202. Specifically, the field is generally measured by way of an acquisition chain that converts the basic magnetic signal into a signal that is exploitable by the controller, for example, into a current, a voltage or digital bits. A scale factor is generally applied to interpret the signal output from the acquisition chain. Determining the baseline to a sufficiently high resolution allows this effect to be observed and corrected. For example, the controller calibrates the scale factors of each component of the variometer MV by carrying out the steps of:

a) measuring the amplitudes of the variations in the baselines with respect to the amplitudes of the signals of each of the three components of the local magnetic field vector $\vec{F}$ during a preestablished length of time;

b) multiplying the three measurements of the variometer MV: dU, dV, and dW by correctional factors, the scale factors, $f_U$, $f_V$, $f_W$;

c) subtracting the corrected values and calculating the baselines using:

$$U_0 = g_U(F,D,I) - f_U * dU$$

$$V_0 = g_V(F,D,I) - f_V * dV$$

$$W_0 = g_W(F,D,I) - f_W * dW$$

d) increasing or decreasing the respective scale factors in order to decrease the variations in the respective baselines;
e) correcting the measurements of the variometer MV by multiplying by the respective scale factors;
steps a) to d) may be repeated until the increase or decrease in the scale factors is smaller than a preset value.

For example, in the case of the declination D:

$$D_0^*(t) = D(t) - \delta D^*(t)$$

$$\delta D^*(t) = (1+\alpha)\delta D(t)$$

$$D_0^*(t) = D(t) - \delta D(t) - \alpha * \delta D(t)$$

$$D_0^*(t) = D_0 - \alpha * \delta D(t)$$

with: $D_0^*(t)$: the LDB calculated with a poor scale factor and $\alpha$: the scale-factor error. The preceding equations are transposable to the other components of the magnetic field.

Lastly, the variometer MV may exhibit an orthogonality error and/or an orientation error or be poorly orientated so as to measure "non-conventional" components. These errors must be corrected and calibrated by the controller 202. In this case, it is possible to detect a correlation between a component measured by the variometer MV and the LDB of another component by means of regular absolute measurements. Once again, the correction tends to minimize this correlation. The correction consists in applying a change of basis matrix in order to regain the basic components of the magnetic field. The change of basis matrix is referred to as a Eulerian matrix, E. The controller thus calibrates the orthogonality and the orientation in space of the three mathematically independent components of the variometer MV and calculates Eulerian rotation matrices E by carrying out the steps of:

a) examining the variation in the baseline of a component as a function of the amplitude of the signal of the other components during a preset length of time;
b) calculating the Eulerian rotation matrices E and adjusting the orientations until the variation in the baseline is smaller than a preset value.

The aforementioned errors may be present when the observatory is commissioned, vary or appear in time. The variometer MV may, for example, be installed on an unstable plinth. The correction must then be made during the exploitation of the observatory. In particular, the present invention may control and correct these errors in real-time.

Once the various calibrations have been performed, the controller 202 calculates the value of the local magnetic field vector $\vec{F}$ by carrying out steps of:

a) S871: obtaining oriented measurements by applying Eulerian rotations E to the three measurements of the variometer MV: dU, dV, and dW;
b) S872: obtaining measurements that are to scale by multiplying the three oriented measurements of the variometer MV by the scale factors;
c) S873: obtaining the 3 components of the local magnetic field vector $\vec{F}$ by adding the baselines to the three oriented and to-scale measurements.

For example, the variometer MV may measure the variations in the X, Y, Z components, H and F components, which are generally expressed in nanotesla (nT), or angular components D and I, which are generally expressed in arcmin, arcsec, degrees-minutes-seconds or decimal degrees. The modulus of the local magnetic field is given by the scalar magnetometer MS, the absolute values of the angular components, preferably the declination D and the inclination I, are delivered by the angular magnetometer MA.

Case of an Observatory in XYZ Configuration

The variometer MV measures variations in the Cartesian components of the field, each sensing axis being oriented in the direction of the component to be measured. The baselines of each component are: $X_0 = X(t) - \delta X(t)$, $Y_0 = Y(t) - \delta Y(t)$, $Z_0 = Z(t) - \delta Z(t)$. These baselines (LDB) are assumed to remain constant. However, it is possible for the scale factors of the measurements to be erroneous. A correlation between LDB and its component then appears. An iterative process then allows the scale factor to be adjusted. For example, for X:

$$X_0^*(t) = X(t) - (1+\alpha)\delta X(t), X_0^*(t) = X_0 - \alpha * \delta X(t), \text{corr}(X_0^*(t), X(t)) \neq 0,$$

where corr is the linear correlation coefficient. It is possible to seek to minimize the correlation coefficient (or the covariance) or to directly minimize the variations in LDB or a combination of both. One possible solution consists in carrying out a plurality of absolute measurements per day (e.g. every 30 minutes or every hour) and in observing a diurnal variation in LDB corresponding to the diurnal variation in its component. The following are then determined:

$$t_1 = t \mid X_0^*(t_1) = \max(X_0^*(t)), \; t_2 = t \mid X_0^*(t_2) = \min(X_0^*(t)),$$

$$\alpha \approx \frac{X_0^*(t_1) - X_0^*(t_2)}{\delta X(t_1) - \delta Y(t_2)}$$

Alternatively, the measurements may be spread over several days and may also be averaged or smoothed.

Figure 9A:
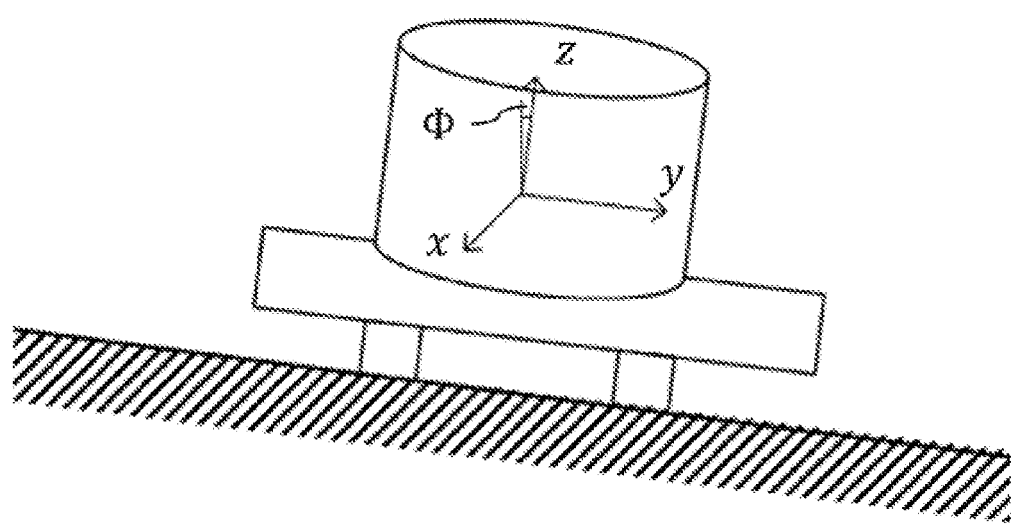
FIG. 9a shows a levelling error along an east-west axis corresponding to a rotation about an X-axis.

The measurements may contain an orientation error. Once again, one solution consists in measuring the LDB at a frequency allowing a diurnal variation to be observed. FIG. 9a shows an example of a levelling error $\phi$ along an east-west axis corresponding to a rotation about the X-axis. The output of the sensor then becomes (in matrix notation):

$$\begin{pmatrix} \delta X^* \\ \delta Y^* \\ \delta Z^* \end{pmatrix} = \begin{pmatrix} 1 & 0 & 0 \\ 0 & \cos(\phi) & \sin(\phi) \\ 0 & -\sin(\phi) & \cos(\phi) \end{pmatrix} \begin{pmatrix} \delta X \\ \delta Y \\ \delta Z \end{pmatrix}$$

A rotation matrix defining a rotation about an X-axis is obtained. The calculation of the LDB such as presented above then requires the inverse transformation, which is none other than the transpose of the preceding matrix.

$$\begin{pmatrix} \delta X \\ \delta Y \\ \delta Z \end{pmatrix} = \begin{pmatrix} 1 & 0 & 0 \\ 0 & \cos(\phi) & -\sin(\phi) \\ 0 & \sin(\phi) & \cos(\phi) \end{pmatrix} \begin{pmatrix} \delta X^* \\ \delta Y^* \\ \delta Z^* \end{pmatrix}$$

The value of φ may be determined empirically or by (optionally iterative) calculation taking into account the LDB. It is, for example, possible to seek to minimize the variance of the baseline or the covariance of the LDB with another component. In the case of a small orientation error, it may be assumed that: $\cos(\phi) \approx 1$ and $\sin(\phi) \approx \phi$ (in radians):

$$Z_0^* = Z - \delta Z^*, Z_0^* = Z - (\delta Z - \phi \delta Y), Z_0^* = Z_0 + \phi \delta Y.$$

The variation in LDB is therefore proportional to the Y-component of the measurements of the variometer MV. If $Z_0$ is considered to be a constant, it is possible to estimate the value of φ from:

$$\phi = \frac{Z_0^* - Z_0}{\delta Y}$$

However $Z_0$ is not directly accessible. One solution is to measure the peak-to-peak variations in $Z_0^*$ and $\delta Y$, which variations are optionally filtered or smoothed in order to avoid measurement-noise effects:

$$t_1 = t \mid Z_0^*(t_1) = \max(Z_0^*(t)), t_2 = t \mid Z_0^*(t_2) = \min(Z_0^*(t)),$$

$$\phi \approx \frac{Z_0^*(t_1) - Z_0^*(t_2)}{\delta Y(t_1) - \delta Y(t_2)}.$$

Figure 9B:
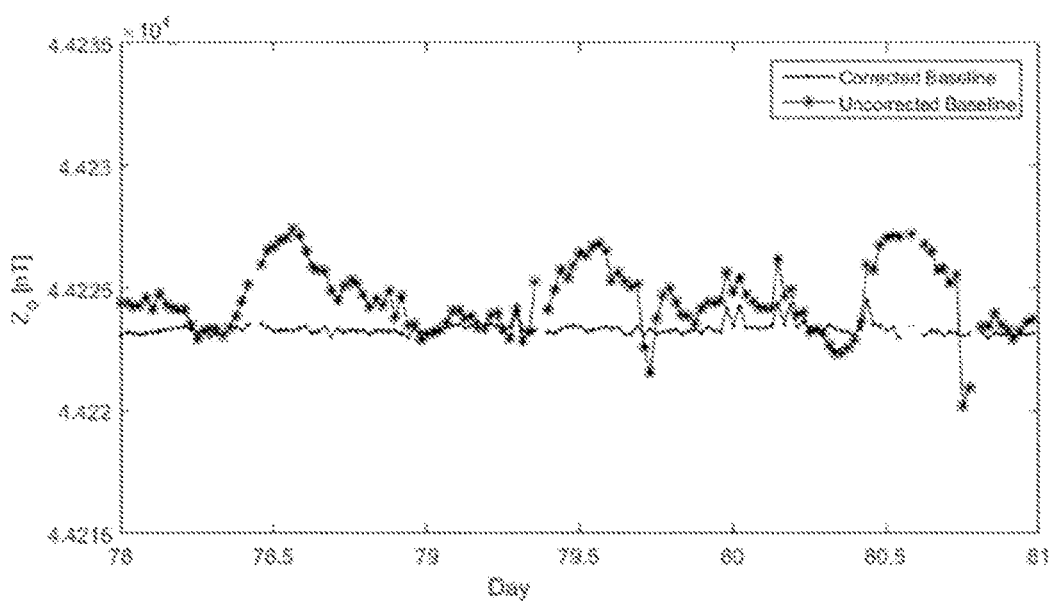
FIG. 9b shows an example of a measurement of the baseline of a Z-component of the field exhibiting a levelling error in the east-west direction.

FIG. 9b shows an example of a measurement of the baseline $Z_0$ of a Z-component of the field, exhibiting a levelling error in the east-west direction. In particular, FIG. 9b illustrates the case of a levelling error of 5° in the east-west direction. The variations in the uncorrected baseline $Z_0$ (in nanotesla, nT) (Uncorrected Baseline) and the corrected baseline (Corrected Baseline) are shown over a period of three days (x-axis representing day).

Case of an Observatory with any Orientation

Figure 10:
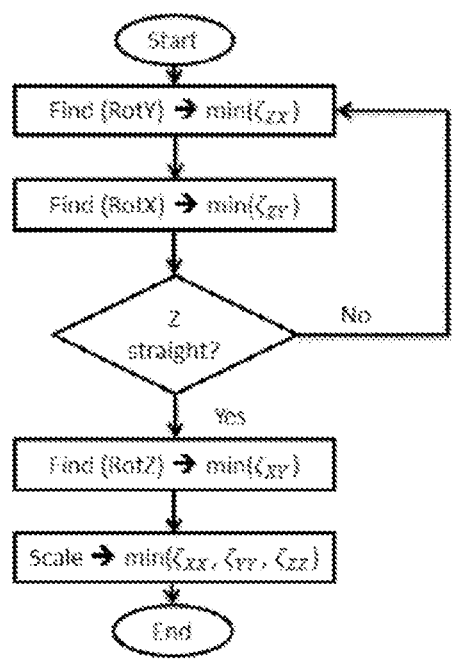
FIG. 10 shows an example of an algorithm allowing scale-factor and orientation errors of the variometer to be determined.

In the case of a variometer with any orientation, one possible algorithm is presented in FIG. 10. It consists in successively applying rotation matrices Rx and Ry defining rotations about the X-axis and Y-axis, respectively, so as to mathematically right the Z-axis. These virtual rotations are determined so as to minimize a particular coefficient such as the variance of $Z_0^*$ or the covariance of $Z_0^*$ and $\delta Y$ or $\delta X$ or a combination of both. For example, the two parameters to be minimized may be determined as follows:

$$\zeta_{ZY} = \sqrt{VAR(Z_0^*)^2 + COV(Z_0^*, \delta Y)^2}$$

$$\zeta_{ZX} = \sqrt{VAR(Z_0^*)^2 + COV(Z_0^*, \delta X)^2}$$

where COV(A,B) is the covariance of A and B. Next, a rotation matrix defining a rotation about the Z-axis is applied so as to minimize the variance of $X_0^*$ or $Y_0^*$ or the covariance of these LDBs with $\delta Y$ or $\delta X$ or a combination of these parameters. A similar process may be employed upstream or downstream of the orientation correction to adjust the scale factors. The whole algorithm may include a plurality of iterations.

Case of an Observatory in DFI Configuration

The variometer MV measures variations in the components of the field corresponding to a system of spherical coordinates. The variometer MV measures variations in the local magnetic field in three orthogonal directions, one of which is oriented parallel to the magnetic field, and measures its strength in the same way as in a Cartesian configuration. The two other directions are located in a plane perpendicular to the magnetic field. In particular, the direction allowing the relative measurement of D is located in a horizontal plane that is perpendicular to the magnetic field whereas the direction allowing the measurement of I is located on the magnetic meridian. These two axes record the projection of the magnetic field (H for the measurement of D and F for the measurement of I). A similar transformation to that employed during the absolute measurements of D and I then makes it possible to pass from a residue to an angular value.

Just as for the Cartesian configuration, the measurements of MV may be corrupted by a scale-factor error. A similar procedure is then employed to adjust them, namely: carrying out LDB measurements at high frequency (e.g. each hour) and adjusting the scale factor of a (relative) component in order to minimize the variation in the LDB thereof. A linear correlation coefficient may be employed.

An error in the alignment of MV produces effects that depend on the measured component. For F and I, the effect is not critical because it is the total field F that is projected. The relationship is therefore of the second order. In contrast, the relative measurement of D uses the projection of H (sensing axis in the horizontal plane). A horizontality error induces a projection of the Z-component of the field. A dependence of LDB dependent on F sin(I) is obtained. The adjustment therefore consists in determining a correlation between the calculated component Z=F sin(I) and the LDB of D.

Case of an Observatory in HDZ Configuration

The variometer MV measures variations in the components of the field corresponding to a system of cylindrical coordinates. It may be considered to be intermediate between the two preceding ones. A generalization may be made in the case of any orientation of MV.

The present invention has been described with reference to specific embodiments, which have a purely illustrative value and must not be considered to be limiting. Generally, the present invention is not limited to the examples illustrated and/or described above. In particular, the invention also relates to combinations of the technical features of the embodiments given above. The use of the verbs "to comprise", "to contain", "to include", or any other variant, and the conjugations thereof, can in no way exclude the presence of elements other than those mentioned. The use of the indefinite article "a" or the definite article "the", to introduce an element does not exclude the presence of a plurality of these elements. The reference numbers in the claims do not limit their scope.

To summarize, the invention may also be described as follows. Autonomous magnetic observatory 200 that comprises a scalar magnetometer MS for measuring the modulus of the local magnetic field vector F, an angular magnetometer MA for measuring the direction of the vertical V, the direction of geographic north N, and the direction of the local magnetic field vector $\vec{F}$, a variometer MV for measuring three variations in the local magnetic field vector $\vec{F}$, a clock 201, and a controller 202. In which observatory the controller is configured to control and manage the sensor orientations, to acquire the measurements of the variometer MV, of the scalar magnetometer MS, of the angular magnetometer MA and of the variometer MV, and to process the acquired measurements in order to automatically obtain the local magnetic field vector $\vec{F}$ and the errors in the measurements associated with each instrument.

The invention claimed is:

1. A magnetic observatory (200) for measuring the local magnetic field vector ($\vec{F}$) comprising:
   a) a scalar magnetometer (MS) for obtaining the absolute measurement of the modulus of the local magnetic field vector (F);
   b) an angular magnetometer (MA) comprising:
      1) a first holder (320) that is orientable about a first axis of rotation called the main axis of rotation (321) allowing a horizontal orientation of the first orientable holder (320) to be obtained, said first orientable holder (320) comprising:
         i. a main motor (322) for modifying the horizontal orientation of the first orientable holder (320) about the main axis (321);
         ii. a second holder (310) that is orientable about a second axis of rotation called the secondary axis of rotation (311) allowing a vertical orientation of the second orientable holder (310) to be obtained, orthogonal to the main axis (321), said second orientable holder (310) comprising: a secondary motor (312) for modifying the vertical orientation of the second orientable holder (310) about the secondary axis (311), and a magnetic sensor (323) for measuring the direction of the local magnetic field vector ($\vec{F}$);
      2) a means (340) for controlling the main and secondary motors (322 and 312);
      3) a device (350) for angularly measuring and acquiring the horizontal and vertical orientations of the first and second orientable holders (320, 310);
   c) a magnetic variometer (MV) that records variations in three mathematically independent components of the local magnetic field vector ($\vec{F}$);
   d) a clock (201);
   characterized in that,
      the first orientable holder (320) of the angular magnetometer (MA) furthermore comprises: an inclination sensor (313), mounted on the first orientable holder (320) or on the second orientable holder (310);
      the second orientable holder (310) of the angular magnetometer (MA) furthermore comprises: a north-seeking device (324);
      the observatory comprises a controller (202) configured to:
   a) automatically control the main motor 322 and secondary motor 312;
   b) manage the orientation of the:
      1) inclination sensor (313) for measuring the direction of the vertical (V);
      2) north-seeking device (324) for measuring the direction of geographic north (N);
      3) magnetic sensor (323) for measuring the direction of the local magnetic field vector ($\vec{F}$);
   c) acquire:
      1) the angles of the direction of the local magnetic field vector ($\vec{F}$) with respect to geographic north (N) and to the vertical (V) depending on the horizontal and vertical orientations of the first and second orientable holders, which orientations are measured with the angularly measuring and acquiring device (350);
      2) the three variations in the local magnetic field vector ($\vec{F}$) that are measured by the variometer (MV);
      3) the values of the modulus of the local magnetic field vector (F) that are measured by the scalar magnetometer (MS);
   d) process the data acquired in step c) in order to automatically obtain the local magnetic field vector ($\vec{F}$) and the errors in the measurements associated with each instrument.

2. The observatory as claimed in claim 1, characterized in that the first and second orientable holders, the main and secondary motors, the north-seeking device (324), the inclination sensor, the means (340) for controlling the main and secondary motors and the angularly measuring and acquiring device (350) are formed from non-magnetic components, defined such that the magnetic susceptibility of the materials is comprised between $-1$ and $1$, preferably between $-10^{-1}$ and $10^{-1}$, and even more preferably between $-10^{-3}$ and $10^{-3}$.

3. The observatory as claimed in claim 2, wherein the non-magnetic components are materials chosen from: ceramic, aluminum, arcap, titanium, copper, ertalon, nylon, ertacetal, peek.

4. The observatory as claimed in claim 1, wherein the scalar magnetometer (MS) is of one of the following types: proton magnetometer, Overhauser-effect magnetometer, atomic magnetometer, optically pumped magnetometer.

5. The observatory as claimed in claim 1, wherein the magnetic sensor (323) is a sensor of one of the following types: fluxgate, fluxset, electrical circuit in rotation or a scalar magnetometer polarized by a magnetic device.

6. The observatory as claimed in claim 1, wherein the north-seeking device (324) is of one of the following types: GNSS, GPS, target pointing, celestial-body pointing, gyroscope, absolute-rotation detector, sunlight polarization.

7. The observatory as claimed in claim 1, comprising a plurality of non-magnetic plinths, supporting at least one of the following elements: the scalar magnetometer (MS), the angular magnetometer (MA), the variometer (MV), the clock (201), the controller (202); the non-magnetic plinths having average dimensions of thickness, width, length of between 1, 10, 10 cm and 6, 10, 10 m; respectively, and being separated by an average distance comprised between 0 and 10 m.

8. The observatory as claimed in claim 7, comprising at least one non-magnetic shelter surrounding the plurality of plinths and comprising an insulated wall the average thickness of which is comprised between 1 and 60 cm, the at least one magnetic shelter protecting at least one of the following elements: the scalar magnetometer (MS), the angular magnetometer (MA), the variometer (MV), the clock (201), the controller (202).

9. A method for obtaining the local magnetic field vector ($\vec{F}$) comprising the following steps:
   a) providing a magnetic observatory as claimed in claim 1;
   b) the controller (202) acquires measurements of the modulus of said local magnetic field vector, F, which measurements are measured with the scalar magnetometer (MS) at different times ti;
   c) the controller (202) acquires measurements of the three mathematically independent components of the local magnetic field vector ($\vec{F}$), dU, dV, dW, which measurements are measured with the variometer (MV) at the different times ti;
   d) the controller (202) controls the main motor (322) in order to modify the horizontal orientation of the first orientable holder (320) and, depending on the indications of the inclination sensor, measures the vertical direction, V;

e) the controller (202) controls the main motor (322) and secondary motor (312) in order to modify the horizontal orientation of the first orientable holder (320) and vertical orientation of the second orientable holder (310) and, depending on the indications of the north-seeking device (324), measures the direction of geographic north N;

f) the controller (202) controls the main and secondary motors in order to modify the horizontal and vertical orientations of the angular magnetometer (MA) and, depending on the indications of the magnetic sensor (323), which indications are obtained at the different times ti, measures two angles, D* and I*, corresponding to the direction of the local magnetic field vector ($\vec{F}$);

g) the controller (202) calculates the absolute values of the two angles from the directions obtained in steps d) to f), such that: D=D*−N and I=I*−V;

h) the controller (202) calculates baselines of the variometer (MV) at a time t, which is the average of the different times ti, using the absolute modulus of the local magnetic vector F, obtained as in step b) and the angles obtained as in step g);

i) the controller (202) calibrates the scale factors of each mathematically independent component of the variometer (MV);

j) the controller (202) calibrates the orthogonality and the orientation in space of the three mathematically independent components of the variometer (MV) and calculates Eulerian rotation matrices E;

k) the controller (202) calculates the value of the local magnetic field vector ($\vec{F}$) by carrying out the steps of:
  1) obtaining oriented measurements by applying the Eulerian rotations E, which were obtained in step j), to the three measurements of the variometer (MV): dU, dV, and dW;
  2) obtaining measurements that are to scale by multiplying the three oriented measurements of the variometer (MV) by the respective scale factors obtained in step i);
  3) obtaining the 3 components of the local magnetic field vector ($\vec{F}$) by adding the baselines to the three oriented and to-scale measurements.

10. The method as claimed in claim 9, wherein in step f) the controller (202) measures the two angles, D* and I*, by carrying out the steps of:
a) modifying the horizontal orientation of the first orientable holder (320) until the magnetic sensor (323) indicates a zero, and acquiring the first angle D*;
b) modifying the vertical orientation of the second orientable holder (310) until the magnetic sensor (323) indicates a zero, and acquiring the second angle I*.

11. The method as claimed in claim 9, wherein the controller (202) calculates the baselines of the variometer (MV) on the basis of the three measurements of the variometer (MV): dU, dV, and dW, of the absolute modulus of the local magnetic field vector F, of the two angles characterizing the direction of the local magnetic field vector ($\vec{F}$): the inclination I and the declination D, and, optionally of functions $g_U$, $g_V$, $g_W$ allowing a change of coordinates D, F, I to coordinates U, V, W, to be achieved, and the controller (202) calculates the baselines $U_0$, $V_0$, $W_0$, using:

$$U_0 = g_U(F,D,I) - dU$$

$$V_0 = g_V(F,D,I) - dV$$

$$W_0 = g_W(F,D,I) - dW.$$

12. The method as claimed in claim 9, wherein the controller (202) calibrates the scale factors of each component of the variometer (MV) by carrying out the steps of:
a) measuring the amplitudes of the variations in the baselines with respect to the amplitudes of the signals of each of the three components of the local magnetic field vector ($\vec{F}$) during a preestablished length of time;
b) multiplying the three measurements of the variometer (MV): dU, dV, and dW by correctional factors, the scale factors, $f_U$, $f_V$, $f_W$;
c) subtracting the corrected values and calculating the baselines using:

$$U_0 = g_U(F,D,I) - f_U * dU$$

$$V_0 = g_V(F,D,I) - f_V * dV$$

$$W_0 = g_W(F,D,I) - f_W * dW$$

d) increasing or decreasing the respective scale factors in order to decrease the variations in the respective baselines;
e) correcting the measurements of the variometer (MV) by multiplying by the respective scale factors;
  steps a) to d) may be repeated until the increase or decrease in the scale factors is smaller than a preset value.

13. The method as claimed in claim 9, wherein the controller (202) calibrates the orthogonality and the orientation in space of the three mathematically independent components of the variometer (MV) and calculates the Eulerian rotation matrices E by carrying out the steps of:
a) examining the variation in the baseline of a component as a function of the amplitude of the signal of the other components during a preset length of time;
b) calculating the Eulerian rotation matrices E and adjusting the orientations until the variation in the baseline is smaller than a preset value.

14. The method as claimed in claim 9, wherein step f) comprises: the controller (202) controlling the main and secondary motors in order to modify the horizontal and vertical orientations of the angular magnetometer (MA) and, depending on the indications of the magnetic sensor (323), which indications are obtained at the different times ti, measuring two angles, D* and I*, corresponding to the direction of the local magnetic field vector ($\vec{F}$) by carrying out the steps of:
a) modifying the horizontal orientation of the first orientable holder (320) so that the magnetic sensor (323) indicates a zero measurement value and acquiring the orientation D1 of the first orientable holder (320) corresponding to this measurement;
b) modifying the horizontal orientation of the first orientable holder (320) by 180° and adjusting the horizontal orientation so that the magnetic sensor (323) indicates a zero measurement value and acquiring the orientation D2 of the first orientable holder (320) corresponding to this measurement;
c) modifying the vertical orientation of the second orientable holder (310) by 180° and adjusting the horizontal orientation of the first orientable holder (320) so that the magnetic sensor (323) indicates a zero measurement value and acquiring the orientation D3 of the first orientable holder (320) corresponding to this measurement;

d) modifying the horizontal orientation of the first orientable holder (320) by 180° and adjusting the horizontal orientation so that the magnetic sensor (323) indicates a zero measurement value and acquiring the orientation D4 of the first orientable holder (320) corresponding to this measurement;

e) calculating the first angle corresponding to the horizontal direction of the local magnetic field by calculating the average of the four measurements: D*=(D1+D2+D3+D4)/4;

f) modifying the horizontal orientation of the first orientable holder (320) to the direction D*−90°;

g) carrying out steps a) to c) in which the horizontal and vertical orientations are inverted and in which the roles of the first and second orientable holders (320 and 310) are inverted, and thus acquiring the orientations I1, I2, I3;

h) modifying the horizontal orientation of the first orientable holder (320) to the direction D*−90° and adjusting the vertical orientation of the second orientable holder (310) so that the magnetic sensor (323) indicates a zero measurement value and acquiring the orientation I4 of the second orientable holder (310) corresponding to this measurement;

i) calculating the second angle corresponding to the second direction of the local magnetic field by calculating the average of the four measurements: I*=(I1+I2+I3+I4)/4.

15. The method as claimed in claim 9, wherein the north-seeking device (324) is a seeker of the absolute-rotation-detector type and wherein step e) of claim 9 comprises: the controller (202) controlling the main motor (322) and secondary motor (312) in order to modify the horizontal orientation of the first orientable holder (320) and the vertical orientation of the second orientable holder (310) and, depending on the indications of the north-seeking device (324), measuring the direction of geographic north N by modifying the horizontal orientation of the first orientable holder (320) until the absolute-rotation detector indicates a zero measurement value and acquiring the orientation N of the first orientable holder (320) corresponding to this measurement.

16. The method as claimed in claim 9, wherein the north-seeking device (324) is a seeker of the absolute-rotation-detector type and wherein step e) of claim 9 comprises steps a) to e) of claim 14, steps in which the magnetic sensor (323) is replaced by the absolute-rotation detector and the orientations D1, D2, D3, D4 and D* are replaced by N1, N2, N3, N4 and N.

17. The method as claimed in claim 9, wherein the scalar magnetometer (MS) and the variometer (MV) carry out measurements with a frequency comprised between 0.01 Hz and 100 Hz.

18. The method as claimed in claim 9, wherein the measurements of the orientation of the local magnetic field vector ($\vec{F}$) are carried out with a frequency comprised between $10^{-7}$ Hz and $10^{-2}$ Hz.

19. The observatory as claimed in claim 1, wherein the plurality of non-magnetic plinths are made of concrete.

* * * * *